United States Patent
Härle

(10) Patent No.: US 8,017,416 B2
(45) Date of Patent: Sep. 13, 2011

(54) METHOD FOR THE PRODUCTION OF A PLURALITY OF OPTO-ELECTRONIC SEMICONDUCTOR CHIPS AND OPTO-ELECTRONIC SEMICONDUCTOR CHIP

(75) Inventor: Volker Härle, Waldetzenberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 113 days.

(21) Appl. No.: 10/566,955

(22) PCT Filed: Jul. 22, 2004

(86) PCT No.: PCT/DE2004/001593
§ 371 (c)(1), (2), (4) Date: Aug. 21, 2006

(87) PCT Pub. No.: WO2005/013379
PCT Pub. Date: Feb. 10, 2005

(65) Prior Publication Data
US 2007/0034880 A1   Feb. 15, 2007

(30) Foreign Application Priority Data
Jul. 31, 2003   (DE) .................................. 103 35 080

(51) Int. Cl.
*H01L 21/00* (2006.01)
(52) U.S. Cl. .................. 438/26; 117/104; 257/E51.018
(58) Field of Classification Search .................. 438/116, 438/173, 626, 631, 645, 646, 697–699, 760, 438/22–47, 956; 257/13, 79–103, E51.018–E51.022, 257/E33.001–E33.077; 117/104
See application file for complete search history.

(56) References Cited

U.S. PATENT DOCUMENTS
5,250,462 A   10/1993   Sasaki et al.
(Continued)

FOREIGN PATENT DOCUMENTS
DE   199 11 717 A1   9/2000
(Continued)

OTHER PUBLICATIONS

P.R. Hageman et al., "Improvement of the Optical and Structural Properties of MOCVD Grown GaN on Sapphire by an in-situ SiN Treatment", Willey-VCH Verlag Berlin GmbH, phys. Stat. Sol. (a), vol. 88, No. 2, pp. 659-662, (2001).

(Continued)

*Primary Examiner* — Ha Tran T Nguyen
*Assistant Examiner* — Shaun Campbell
(74) *Attorney, Agent, or Firm* — Cozen O'Connor.

(57) ABSTRACT

Presented is a method for the production of a plurality of optoelectronic semiconductor chips each having a plurality of structural elements with at least one semiconductor layer. The method involves providing a chip composite base that includes a substrate and a growth surface. A mask material layer is formed on the growth surface. The mask material layer includes a multiplicity of windows having an average extent of less than or equal to 1 µm. A mask material is chosen so that a semiconductor material of the semiconductor layer that is to be grown essentially cannot grow on the mask material or can grow in a substantially worse manner in comparison with the growth surface. Subsequently, semiconductor layers are deposited essentially simultaneously onto regions of the growth surface that lie within the windows. The chip composite base with applied material is singulated to form semiconductor chips.

15 Claims, 4 Drawing Sheets

U.S. PATENT DOCUMENTS

| | | | |
|---|---|---|---|
| 5,659,184 A * | 8/1997 | Tokunaga et al. | 257/91 |
| 5,677,924 A | 10/1997 | Bestwick | |
| 5,693,962 A * | 12/1997 | Shi et al. | 257/89 |
| 5,985,696 A | 11/1999 | Brunner et al. | |
| 6,100,104 A * | 8/2000 | Haerle | 438/33 |
| 6,110,277 A | 8/2000 | Braun et al. | |
| 6,255,198 B1 * | 7/2001 | Linthicum et al. | 438/481 |
| 2001/0038655 A1 * | 11/2001 | Tanaka et al. | 372/43 |
| 2002/0104999 A1 | 8/2002 | Nakajima et al. | |
| 2002/0171089 A1 | 11/2002 | Okuyama et al. | |
| 2003/0095737 A1 | 5/2003 | Welch et al. | |
| 2003/0138983 A1 | 7/2003 | Biwa et al. | |
| 2003/0178626 A1 * | 9/2003 | Sugiyama et al. | 257/79 |
| 2005/0022725 A1 | 2/2005 | Jurgensen et al. | |
| 2007/0164306 A1 * | 7/2007 | Nakahata et al. | 257/103 |

FOREIGN PATENT DOCUMENTS

| | | |
|---|---|---|
| DE | 102 06 751 | 7/2002 |
| EP | 0 388 733 A1 | 9/1990 |
| EP | 0 472 221 A2 | 2/1992 |
| EP | 1 005 067 A2 | 5/2000 |
| EP | 1 329 961 A2 | 1/2003 |
| JP | 02 062090 A | 3/1990 |
| JP | 05 226781 A | 12/1993 |
| JP | 08-213712 A | 8/1996 |
| JP | 2002-249400 A | 9/2002 |
| WO | WO 02/17369 A1 | 2/2002 |
| WO | WO 03/054939 | 7/2003 |

OTHER PUBLICATIONS

Yang et al., "Selective area deposited blue GaN-InGaN multiple-quantum well light emitting diodes over silicon substrate", Applied Physics Letters, American Institute of Physics, New York, vol. 76, No. 3, pp. 273-275, Jan. 17, 2000.

Miyata et al., "Selective growth of nanocrystalline Si dots using an ultrathin-Si-oxide/oxynitride mask", Applied Physics Letters, American Institute of Physics, New York, vol. 77, No. 11, pp. 1620-1622, Sep. 11, 2000.

* cited by examiner

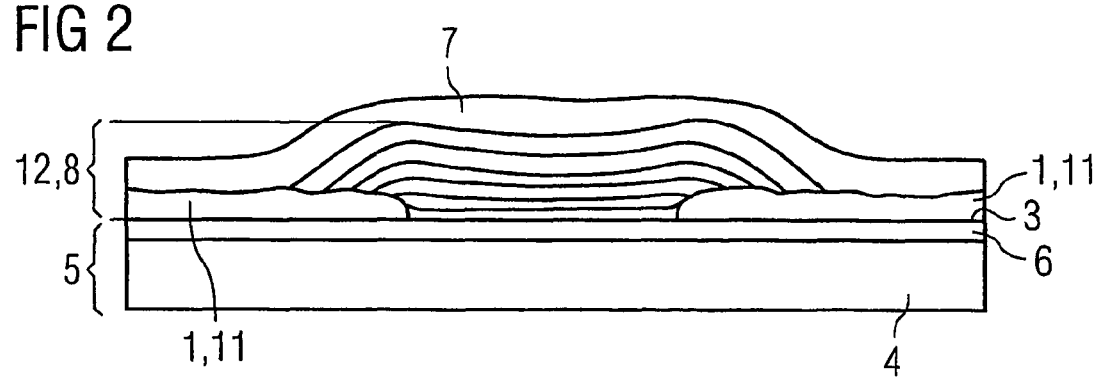
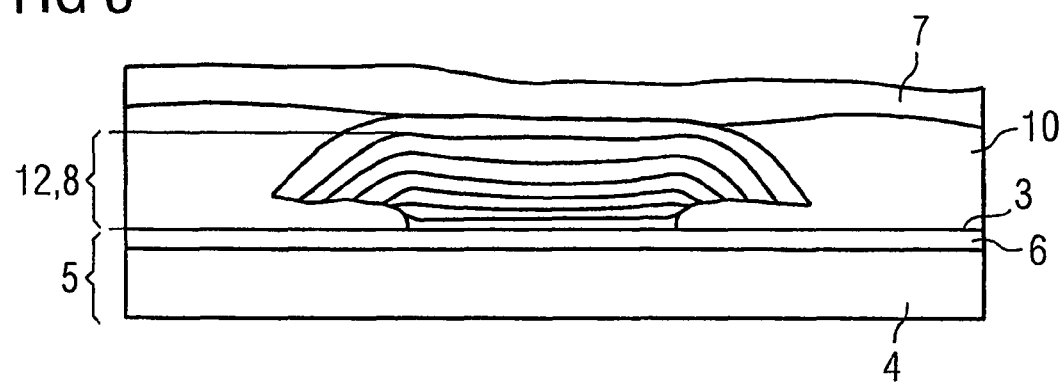

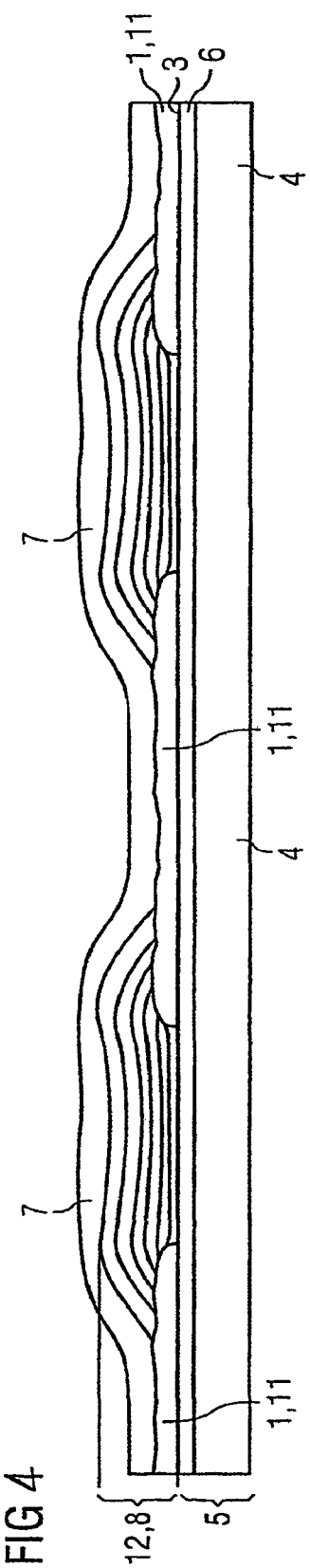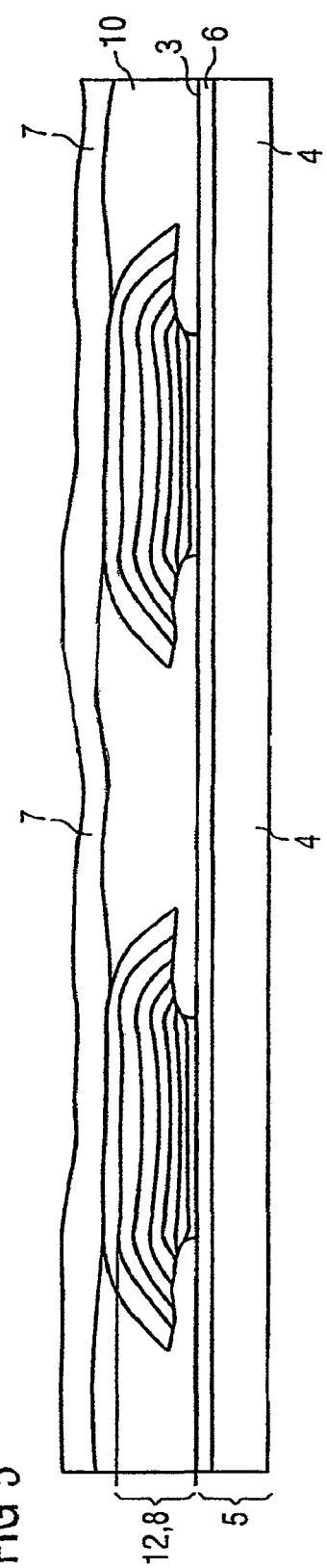

METHOD FOR THE PRODUCTION OF A PLURALITY OF OPTO-ELECTRONIC SEMICONDUCTOR CHIPS AND OPTO-ELECTRONIC SEMICONDUCTOR CHIP

RELATED APPLICATIONS

This is a U.S. national stage of application No. PCT/DE2004/001593, filed on 22 Jul. 2004.

This patent application claims the priority of German Patent Application 10335080.2, the disclosure content of which is hereby incorporated by reference.

FIELD OF THE INVENTION

The invention relates to a method for the production of a plurality of optoelectronic semiconductor chips each having a plurality of structural elements with respectively at least one semiconductor layer. In this case, semiconductor layers of the structural elements are grown by means of selective epitaxy. The invention additionally relates to an optoelectronic semiconductor chip produced according to this method.

BACKGROUND OF THE INVENTION

Such an optoelectronic semiconductor chip and a corresponding method for the production thereof are described in DE 199 11 717 A1, for example. Said chip has a plurality of radiation coupling-out elements comprising e.g. an epitaxially grown semiconductor layer sequence with an active layer that generates electromagnetic radiation. This component thereby has improved coupling-out of radiation.

Each of the radiation coupling-out elements has a ring contact on a top surface, the ring contacts being interconnected by electrically conductive paths. This is a relatively complicated way of making electrically conductive contact with the radiation coupling-out elements, and requires the radiation out-coupling elements to have a certain minimum size.

SUMMARY OF THE INVENTION

One object of the present invention is to provide an improved method for the production of optoelectronic semiconductor chips of the type mentioned in the introduction.

A further object of the present invention is to provide a semiconductor chip produced according to such a method which has improved properties compared with conventional semiconductor chips.

A method for the production of a plurality of optoelectronic semiconductor chips each having a plurality of structural elements with respectively at least one semiconductor layer, comprising the steps of providing a chip composite base having a substrate and a growth surface. A mask material layer is formed on the growth surface, with a multiplicity of windows, most of which have an average extent of less than or equal to 1 μm, wherein a mask material is chosen in such a way that a semiconductor material of the semiconductor layer that is to be grown in a later method step essentially cannot grow on said mask material or can grow in a substantially worse manner in comparison with the growth surface. Semiconductor layers are grown essentially simultaneously on regions of the growth surface that lie within the windows, and the chip composite base with applied material is singulated to form semiconductor chips.

In this context, extent is to be understood as the length of a window projected onto a straight line, the straight line running in a principal extending plane of the mask material layer. The average extent is accordingly the extent of a window averaged over all directions.

With smaller windows in the mask material layer, it is possible to produce smaller structure elements in a larger area density. This may lead to improved properties of the component, such as, for instance, improved coupling-out of electromagnetic radiation generated in the component.

The chip composite base can have at least one semiconductor layer grown epitaxially onto the substrate. In this case, the growth surface is a surface on that side of the epitaxially grown semiconductor layer which is remote from the substrate.

In one advantageous embodiment of the method, the chip composite base has a semiconductor layer sequence grown epitaxially onto the substrate, said semiconductor layer sequence comprising an active zone that emits electromagnetic radiation. The growth surface is correspondingly a surface on that side of the semiconductor layer sequence which is remote from the substrate. The semiconductor layers of the structural elements that are subsequently applied to the growth surface form a patterning which, by way of example, fulfills the purpose of improved coupling-out of the electromagnetic radiation generated in the chip composite base.

As an alternative or in addition, the structural elements respectively have an epitaxially grown semiconductor layer sequence with an active zone that emits electromagnetic radiation.

Preferred materials for the mask material layer have $SiO_2$, $Si_xN_y$ or $Al_2O_3$.

After the growth of the semiconductor layers of the structural elements, a layer made of electrically conductive contact material that is transmissive to an electromagnetic radiation emitted by the active zone can be applied to said semiconductor layers, so that semiconductor layers of a plurality of structural elements are electrically conductively connected to one another by the contact material. It is thereby possible to form electrical contact structures in a simple manner which additionally absorb a small proportion of electromagnetic radiation generated in the component.

In one embodiment of the method, the mask material layer is expediently at least partly removed after the growth of the semiconductor layers.

In a further embodiment of the method, after the growth of the semiconductor layer sequences, advantageously as an alternative or in addition to the removal of mask material, a planarization layer is applied over the growth surface. This may lead to improved coupling-out of light particularly when a material whose refractive index is lower than that of adjoining semiconductor layers is chosen for said planarization layer.

The planarization layer can have a material having dielectric properties.

In the growth of the semiconductor layers of the structural elements, the growth conditions can be set and alternatively or additionally varied during growth in such a way that the semiconductor layers are formed with a form that is advantageous for the coupling-out of electromagnetic radiation, for example an at least appropriately lenslike form.

The mask material layer and the semiconductor layers can be grown by means of metal organic vapor phase epitaxy (MOVPE).

The optoelectronic semiconductor chip is characterized by the fact that it is produced according to the method according to the invention or an embodiment thereof.

BRIEF DESCRIPTION OF THE DRAWINGS

FIG. 2 shows a schematic sectional view of a detail from a first embodiment of the optoelectronic component;

FIG. 3 shows a schematic sectional view of a detail from a second embodiment of the optoelectronic component;

FIG. 4 shows a schematic sectional view of a variation of the optoelectronic component shown in FIG. 2; and FIG. 5 shows a schematic sectional view of a variation of the optoelectronic component shown in FIG. 3.

DETAILED DESCRIPTION OF THE DRAWINGS

Figure 1A:
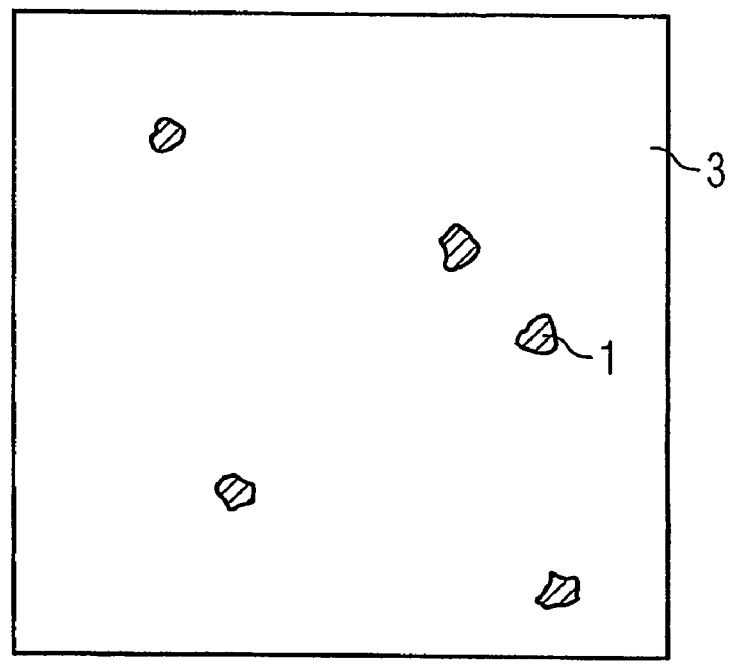
FIGS. 1A to 1D show a schematic plan view of a detail from a growth surface during different stages of an exemplary embodiment of the method.
Figure 1B:
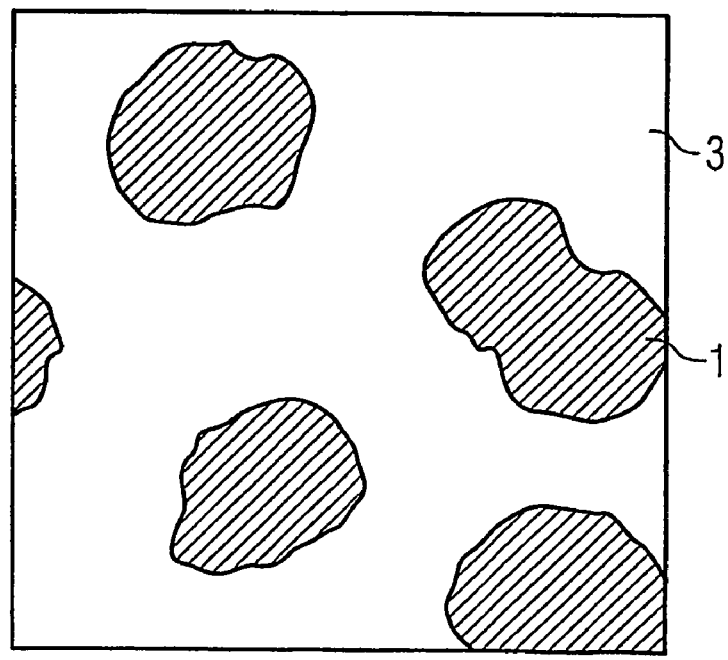
Figure 1C:

In the embodiments and figures, identical or identically acting constituent parts are respectively provided with the same reference symbols. The constituent parts illustrated and also the size relationships among the constituent parts are not to be regarded as true to scale. Rather, some details of the figures are illustrated with an exaggerated size in order to afford a better understanding.

FIGS. 1A to 1D show in chronological succession in each case a detail from a growth surface 3 during the growth of a mask material layer 11 made from a mask material 1. In this case, the mask material layer 11 is grown in situ in a non-closed layer in such a way that a plurality of statistically distributed windows arise. "In situ" means that the growth takes place in the same epitaxy reactor as the growth of semiconductor layers of the component. As an alternative, it is also possible to grow a closed mask material layer in which windows are subsequently formed by means of photolithography and etching.

The growth surface 3 may be for example an area of a substrate made from n-GaAs; the mask material 1 is composed e.g. of $Si_xN_y$.

The growth of the mask material 1 begins at isolated points on the growth surface 3 at which crystallites of mask material 1 form. The crystallites of mask material 1 accrete laterally in the further course of events (see FIGS. 1B to 1D), in which case the growth conditions may be set for example in such a way that two-dimensional growth is predominant, that is to say that the crystallites of mask material 1 grow predominantly in a plane parallel to the growth surface, and only to a lesser degree perpendicular thereto. As an alternative, through corresponding setting of the growth conditions, it is also possible to achieve predominantly three-dimensional growth of the crystallites, that is to say a growth in which the growth rate is of similar magnitude or of an identical order of magnitude in all possible growth directions.

Growth conditions are in this case to be understood as externally settable, controllable or changeable parameters such as e.g. pressure, temperature, material flow and growth duration in the epitaxy reactor. The precise values for such parameters for obtaining a specific growth characteristic can vary greatly and depend for example on the partitioning and the geometrical dimensions of the epitaxy reactor or on the material to be grown.

With the setting of the growth conditions, it is possible in the growth of the mask material layer not just to vary the form or the size of the windows, rather it is also advantageously possible, by way of example, to set the surface density with which the windows are produced on the growth surface.

The production of a non-closed $Si_xN_y$ layer is effected for example in an MOVPE reactor by admitting $SiH_4$ and $NH_3$ at a suitable reactor temperature, which may typically lie in a range of between 500 and 1100° C. However, the reactor temperature may also lie above or below this range. Such methods are described for instance in Hageman, P. R. et al., "Improvement of the Optical and Structural Properties of MOCVD Grown GaN on Sapphire by an in-situ SiN Treatment," phys. stat. sol. (a) 188, No. 2 (2001), 659-662, the content of which is in this respect hereby incorporated by reference. As an alternative, the Si source used may also be tetraethyl-silicon ($Si(C_2H_5)_4$) or a similar Si-containing compound which is suitable for epitaxy.

Figure 1D:

In the growth stage shown in FIG. 1D, the mask material layer 11 has been fully formed. It has a plurality of statistically distributed (i.e, not positioned in a regular array) windows 2 having varying forms and opening areas. The deposition conditions are chosen such that most of the windows have an average extent of less than 1 μm. By means of a small extent of the windows it is possible to produce more and smaller structural elements and e.g. to achieve improved coupling-out of radiation from the component structures.

Subsequently, for example semiconductor layer sequences 8 are deposited selectively on regions of the growth surface 3 that lie within said windows 2 (see FIG. 2 or 3). Said semiconductor layer sequences may be based for instance on phosphide compound semiconductors and preferably have materials $In_nGa_mAl_{1-n-m}P$, where $0 \leq n \leq 1$, $0 \leq m \leq 1$ and $n+m \leq 1$. In this case, these materials may have one or more dopants and additional constituents which essentially do not change the physical properties of the material.

A semiconductor layer sequence 8 forms a structural element 12 with each of said windows 2 having a structural element 12 associated with it. In the sense of the invention, it is also possible in this case for semiconductor layers of a plurality of structural elements to overlap or for a plurality of structural elements to have at least one common semiconductor layer. This is the case for example if semiconductor layer sequences 8 grow laterally over the mask material layer to an extent such that semiconductor layers of adjacent structural elements 12 partly or wholly accrete. In such cases a boundary between two adjacent structural elements runs along a line along which semiconductor material situated on the mask material layer has a minimum thickness.

In FIG. 2, the semiconductor layer sequence 8 forming the structural element 12 has an active zone that emits electromagnetic radiation when current is applied. However, a structural element 12 may also have no active zone and e.g. be formed from only one semiconductor layer having a lenslike form.

The active zone may have a conventional pn junction, for example for a light emitting diode. Such structures are known to the person skilled in the art and are therefore not explained in any greater detail at this conjuncture.

By virtue of the fact that the windows have opening areas of different magnitudes, different material compositions result for the layers of the semiconductor layer sequences 8 that are deposited therein. This is an effect of the so called selective growth epitaxy. Generally, the semiconductor alloys grown will comprise the same elements, but there is a variation in alloy composition depending on the window sizes. The reason for this effect is that different elements of the alloys to be grown have different diffusion constants for diffusion on the mask material. In the case of structures emitting electromagnetic radiation, different emission spectra consequently result, so that with radiation-emitting components of this type it is possible overall to achieve a broader emission spectrum than with conventional components.

FIG. 2 shows a schematic sectional view of a detail from an optoelectronic component produced by the method. The chip composite base 5 comprises a substrate 4 and a semiconductor layer or semiconductor layer sequence 6 which is grown epitaxially on said substrate and whose side remote from the substrate 4 forms the growth surface 3. A mask material layer 11 is grown on the growth surface 3 and, in the component detail shown, has a window into which a semiconductor layer sequence 8 is selectively deposited.

The maximum thickness of the mask material layer 11 may be e.g. only a few nm and is less than the height of the semiconductor layer sequence 8. As a result, semiconductor layers of the semiconductor layer sequence 8, above a height that is greater than the thickness of the mask material layer 11 surrounding them, are also partly grown over the mask material layer 11 by lateral growth.

The growth conditions for the growth of the semiconductor layer sequence 8 are e.g. chosen or varied during growth in such a way that the semiconductor layer sequence 8 is formed with a lenslike form. As an alternative, said form may also be like a truncated cone or polyhedral.

In this context, the term "growth conditions" is to be understood in a manner similar to the growth of mask material 1 explained above. In this case, how precisely the setting of specific values for parameters such as pressure, temperature, material flow and growth duration affects the growth of semiconductor materials depends not only on the type of semiconductor material to be grown and the type of epitaxy installation but also greatly on the type of mask material 1.

In the embodiment illustrated in FIG. 2, the semiconductor layer grown last covers all the remaining semiconductor layers of the semiconductor layer sequence 8. This makes it possible to apply a layer made from electrically conductive contact material 7 for example flat over the entire growth surface 3 or on the semiconductor layer sequence 8 and the mask material 1 without different semiconductor layers of the semiconductor layer sequence 8 being electrically short-circuited. Suitable contact material 7 is for example indium tin oxide (ITO) or else a metal layer a few atomic layers thick, for example made from platinum, which due to its small thickness is transmissive to a radiation emitted by the active zone of the semiconductor layer sequence 8.

A contact material with ITO may additionally have a thin metal layer of this type which is deposited before the ITO. It is thereby possible to improve the electrical conductivity of the contact between contact material 7 and semiconductor layer sequence 8.

In order that an electrically conductive contact forms between the contact material 7 and the semiconductor layer sequence 8, after the application of the contact material 7 the component generally has to be subjected to heat treatment at a suitable temperature for a sufficiently long time. These measures are known to the person skilled in the art and are therefore not explained in any greater detail.

A bonding pad via which the semiconductor layer sequence can be contact-connected from one side e.g. by means of a bonding wire (not shown) may be applied to the contact material 7 before or after the heat treatment.

If the substrate 4 is provided with a contact material and electrically conductively connected on the rear side, that is to say on the side remote from the growth surface, then a voltage can be applied via the bonding pad and the rear side contact directly to the still united components and their functionality can be tested (direct probing).

In the case of the component of the detail shown in FIG. 2, the semiconductor layer sequence 6 arranged on the substrate 4 may alternatively or additionally also have an active zone that emits electromagnetic radiation. When a voltage is applied to the component, the current is restricted through the mask material layer 11 to a region of the windows 2, so that a light generating region is essentially restricted to a part of the active zone of the semiconductor layer sequence 6 which lies below a window 2.

FIG. 3 shows the detail from a second exemplary embodiment of the component. In contrast to the embodiment explained with reference to FIG. 2, the production method in this example comprises, after the application of the semiconductor layer sequence 8, removal of the mask material layer 11, which may be effected by selective etching.

A planarization layer 10 is subsequently applied to the growth surface 3 and the semiconductor layer sequence 8, which planarization layer may be composed e.g. of a dielectric whose refractive index is lower than that of materials of the semiconductor layer sequence 8.

In order that electrically conductive contact can be made with the semiconductor layer sequence 8, the planarization layer 10 is then at least partly thinned or removed, so that the outermost layer of the semiconductor layer sequence 8 is uncovered. Subsequently, analogously to the embodiment explained with reference to FIG. 2, electrically conductive contact material 7 is applied thereto and heat treatment is effected.

Subsequently, the chip composite base 5 with the applied material can be singulated to form a plurality of optoelectronic semiconductor chips. Each of these semiconductor chips comprises a plurality of structural elements 12, as is shown in FIGS. 4 and 5.

The scope of protection of the invention is not restricted by the description of the invention on the basis of the embodiments. By way of example, the windows in the mask material layer can be made so small that quasi one-dimensional semiconductor component structures are grown in them. The invention encompasses any new feature and also any combination of features, which in particular comprises any combination of features in the patent claims even if this combination is not explicitly specified in the claims.

The invention claimed is:

1. A method for the production of a plurality of optoelectronic semiconductor chips each having a plurality of structural elements with each structural element comprising a semiconductor layer sequence, the method comprising the steps of:

providing a chip composite base comprising a substrate and a growth surface;

forming on the growth surface a mask material layer with a multiplicity of windows, most of which have an average lateral extent of less than or equal to 1 μm, wherein a mask material is chosen so that a semiconductor material of the semiconductor layer sequence that is to be grown in a later method step essentially cannot grow on said mask material or can grow in a substantially worse manner in comparison with the growth surface, and wherein the windows of the mask material layer comprise a plurality of statistically distributed windows having varying forms and opening areas;

essentially simultaneously growing semiconductor layers to form the structural elements on regions of the growth surface that lie within the windows; and singulating the chip composite base with applied material to form semiconductor chips each having a plurality of the structural elements;

wherein, after the growth of the semiconductor layers, a layer of electrically conductive contact material that is transmissive to an electromagnetic radiation emitted by an active zone is applied to the semiconductor layers, so that the semiconductor layers of a plurality of the structural elements are electrically conductively connected to one another by the contact material.

2. The method as claimed in claim 1, wherein the chip composite base has at least one semiconductor layer grown epitaxially onto the substrate and the growth surface is a surface on that side of the epitaxially grown semiconductor layer which is remote from the substrate.

3. The method as claimed in claim 1, wherein the chip composite base has a semiconductor layer sequence grown epitaxially onto the substrate with an active zone that emits electromagnetic radiation, and the growth surface is a surface on that side of the semiconductor layer sequence which is remote from the substrate.

4. The method as claimed in claim 1, wherein the structural elements respectively have an epitaxially grown semiconductor layer sequence with an active zone that emits electromagnetic radiation.

5. The method as claimed in claim 1, wherein the mask material has $SiO_2$, $Si_xN_y$, or $Al_2O_3$.

6. The method as claimed in claim 1, wherein the average thickness of the mask material layer is less than the cumulated thickness of the semiconductor layers of a structural element.

7. The method as claimed in claim 1, wherein the mask material layer is at least partly removed after the growth of the semiconductor layers.

8. The method as claimed in claim 1, wherein, after the growth of the semiconductor layers, a planarization layer is applied over the growth surface.

9. The method as claimed in claim 8, wherein a material whose refractive index is lower than that of the semiconductor layers is chosen for the planarization layer.

10. The method as claimed in claim 8, wherein a dielectric material is chosen for the planarization layer.

11. The method as claimed in claim 1, wherein the growth conditions for the growth of the semiconductor layers are at least one of set and varied during growth in such a way that semiconductor layers of the structural elements form a lens-shaped form, a truncated cone-shaped form, or a polyhedral form.

12. The method as claimed in claim 1, wherein the semiconductor layers are grown by means of metal organic vapor phase epitaxy.

13. An optoelectronic semiconductor chip produced according to a method as claimed in claim 1.

14. The method as claimed in claim 1, wherein the mask material layer is grown on the growth surface.

15. The method as claimed in claim 14, wherein the mask material layer is grown in situ in a non-closed layer including the multiplicity of windows.

* * * * *